United States Patent
Byrnes, Jr. et al.

(10) Patent No.: US 7,248,015 B2
(45) Date of Patent: Jul. 24, 2007

(54) VARIABLE SPEED MOTOR CONTROL CIRCUIT

(75) Inventors: Howard P. Byrnes, Jr., Dallas, TX (US); Walter W. Bowman, McKinney, TX (US)

(73) Assignee: Hoffman Controls Corp., Dallas, TX (US)

( * ) Notice: Subject to any disclaimer, the term of this patent is extended or adjusted under 35 U.S.C. 154(b) by 0 days.

(21) Appl. No.: 11/257,586

(22) Filed: Oct. 24, 2005

(65) Prior Publication Data

US 2006/0097687 A1 May 11, 2006

Related U.S. Application Data

(60) Provisional application No. 60/621,479, filed on Oct. 22, 2004.

(51) Int. Cl.
*H02P 3/18* (2006.01)
(52) U.S. Cl. ............... 318/751; 318/109; 318/729; 318/786
(58) Field of Classification Search ........... 318/109, 318/729, 786, 775
See application file for complete search history.

(56) References Cited

U.S. PATENT DOCUMENTS

| | | | | |
|---|---|---|---|---|
| 3,792,324 A | * | 2/1974 | Suarez et al. | 318/786 |
| 4,409,532 A | * | 10/1983 | Hollenbeck et al. | 318/749 |
| 4,806,838 A | * | 2/1989 | Weber | 318/729 |
| 4,808,078 A | * | 2/1989 | Havens et al. | 417/38 |
| 5,041,771 A | * | 8/1991 | Min | 318/786 |
| 5,159,255 A | * | 10/1992 | Weber | 318/775 |
| 6,121,749 A | * | 9/2000 | Wills et al. | 318/811 |
| 7,045,979 B2 | * | 5/2006 | Mehlhorn et al. | 318/109 |
| 2004/0169479 A1 | * | 9/2004 | Mehlhorn et al. | 318/109 |

* cited by examiner

*Primary Examiner*—Paul Ip
(74) *Attorney, Agent, or Firm*—Gardere Wynne Sewell LLP

(57) ABSTRACT

A control system and method for controlling the speed of a PSC motor having an auxiliary winding configured to provide torque for initial motor startup and a run winding configured to provide continuous motor operation. The motor is coupled to a capacitor configured to direct a portion of a current through the run winding when the PSC motor reaches its intended speed. The control system includes a speed control unit coupled between a voltage line and the PSC motor and a bypass circuit coupled between the voltage line and the capacitor via a first path. The speed control unit is configured to variably control the speed of the PSC motor. The bypass circuit is configured to receive a control signal from the speed control unit via a second path and to regulate a chopped voltage wave form generated by the speed control unit such that at least a portion of the chopped voltage wave form is not applied to the capacitor.

31 Claims, 7 Drawing Sheets

VARIABLE SPEED MOTOR CONTROL CIRCUIT

CROSS REFERENCE TO RELATED APPLICATIONS

The present document claims the benefit of the earlier filing date of co-pending U.S. provisional patent application Ser. No. 60/621,479, entitled "VARIABLE SPEED MOTOR CONTROL CIRCUIT," filed in the U.S. Patent and Trademark Office on Oct. 22, 2004 and having a common inventor as the present document, the entire contents of which is incorporated herein by reference.

BACKGROUND OF THE INVENTION

1. Field of the Invention

The present invention relates to single phase permanently split capacitor (PSC) motor control circuits and more particularly to a variable speed motor control circuit having a bypass circuit which independently controls the auxiliary winding circuit of the PSC motor.

2. Discussion of the Background

Single phase PSC single and multiple speed motors are generally designed to operate at one or several specific speeds, respectively. However, it may sometimes be necessary to provide a variable speed capability for motors of this type, in order to allow motor operation at any speed over a range between minimum and maximum speed levels. Accordingly, a speed control may be coupled to the motor voltage source to selectively "chop" or phase proportion the voltage wave form. Referring to FIG. 1, an operating point other than synchronous speed or "full speed" of a motor control circuit configured to vary a motor speed is shown. The phase proportioning may be carried out by means of a triac or other component, operated as a switch, to pass only a portion of each wave form to the motor as shown by FIG. 1. The wave form portion can be varied to controllably vary a motor speed, by changing the time at which the switch is closed.

Referring to FIG. 2, a block diagram of a conventional arrangement of a motor control circuit configured to vary a motor speed is shown. In this configuration, a speed control 10 of the above type is coupled to a voltage source, such as a line L2, of a motor 12. However, either L1 or L2 may be configured as neutral, but not simultaneously. In this configuration, motor 12 necessarily comprises a single or multiple speed permanent split capacitor (PSC) motor, and is not applicable to shaded pole motors. This configuration also does not apply to a motor of a type in which the auxiliary winding is switched out of series with the start capacitor by mechanical means, such as a centrifugal switch or the like, commonly referred to as a "split phase" motor. Motor 12 is configured with an auxiliary winding 14 that is generally designed to adequately provide torque for initial motor start up and to improve the efficiency of the phase angle of the motor at full speed. After start up, a run winding 16 provides continuous motor operation. A capacitor 18 is shown connected in series with auxiliary winding 14, to ensure the motor rotates in the proper direction as it starts, and also to provide additional torque for start up. When the motor reaches its intended speed, the impedance in the capacitor 18 becomes high, thereby causing most of the motor current to flow through the run winding 16 and not the auxiliary winding 14. Thereafter, as the motor is being driven by run winding 16, speed control 10 is operated to vary motor speed as previously described.

Unfortunately, in a conventional arrangement, as shown in FIG. 2, the chopped voltage is applied to auxiliary winding 14 and capacitor 18 as well as to run winding 16. This results in loss of efficiency and harmonic distortion of the motor voltage, which in turn results in vibration, noise, and excessive heating of the motor.

SUMMARY OF THE INVENTION

Accordingly, one aspect of the present invention is a control system for controlling the speed of a PSC motor having an auxiliary winding configured to provide torque for initial motor startup and a run winding configured to provide continuous motor operation. The motor is coupled to a capacitor configured to direct a portion of a current through the run winding when the PSC motor reaches its intended speed. The control system includes a speed control unit coupled between a voltage line and the PSC motor and a bypass circuit coupled between the voltage line and the capacitor via a first path. The speed control unit is configured to variably control the speed of the PSC motor. The bypass circuit is configured to receive a control signal from the speed control unit via a second path and to regulate a chopped voltage wave form generated by the speed control unit such that at least a portion of the chopped voltage wave form is not applied to the capacitor.

Another aspect of the present invention is a method for controlling the speed of a PSC motor having an auxiliary winding configured to provide torque for initial motor startup and a run winding configured to provide continuous motor operation. The motor is coupled to a capacitor configured to direct a portion of a current through the run winding when the PSC motor reaches its intended speed. The method includes coupling a voltage line and the PSC motor with a speed control unit configured to variably control the speed of the PSC motor, coupling the voltage line and the capacitor with a bypass circuit via a first path, receiving a control signal from the speed control unit via a second path, and regulating a chopped voltage wave form generated by the speed control unit such that at least a portion of the chopped voltage wave form is not applied to the capacitor.

BRIEF DESCRIPTION OF THE DRAWINGS

A more complete appreciation of the present invention and many of the attendant advantages thereof will be readily obtained as the same becomes better understood by reference to the following detailed description when considered in conjunction with the accompanying drawings, wherein.

DETAILED DESCRIPTION OF THE PREFERRED EMBODIMENTS

Figure 1:
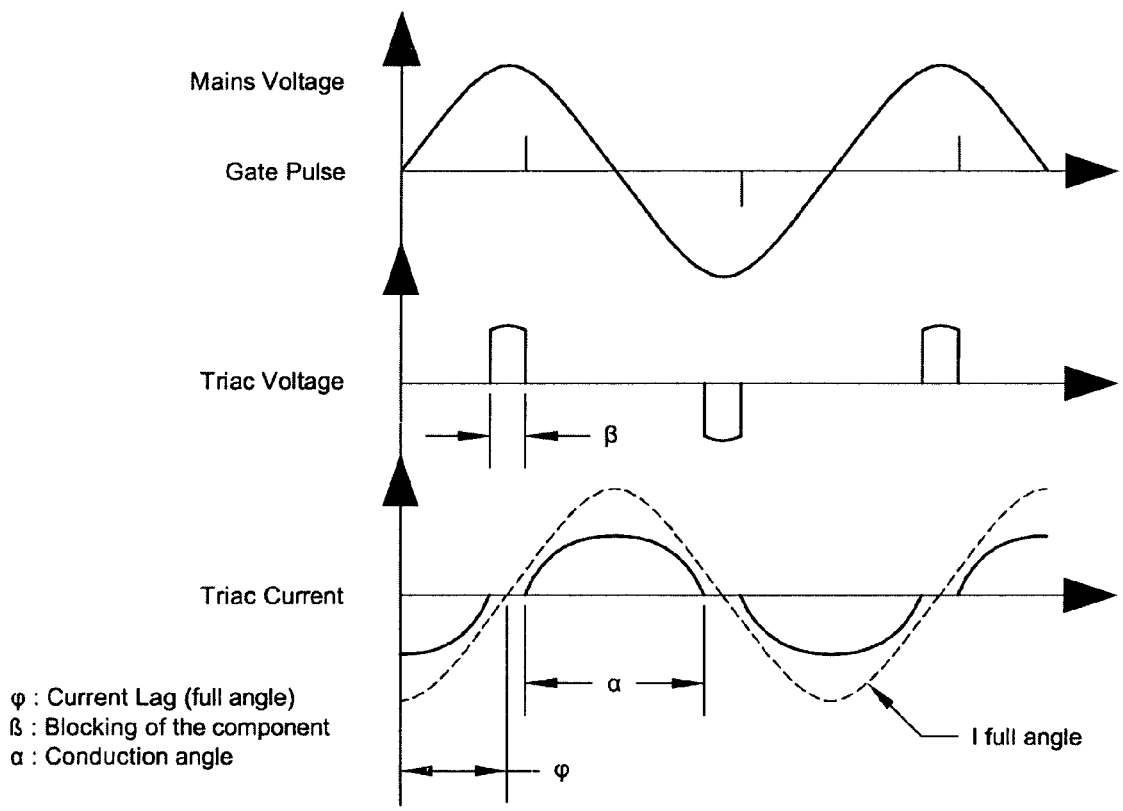
FIG. 1 graphically depicts an operating point other than synchronous speed or "full speed" of a motor control circuit configured to vary a motor speed.

Referring now to the drawings, wherein like reference numerals designate identical or corresponding parts throughout the several views, preferred embodiments of the present invention are described.

Figure 2:
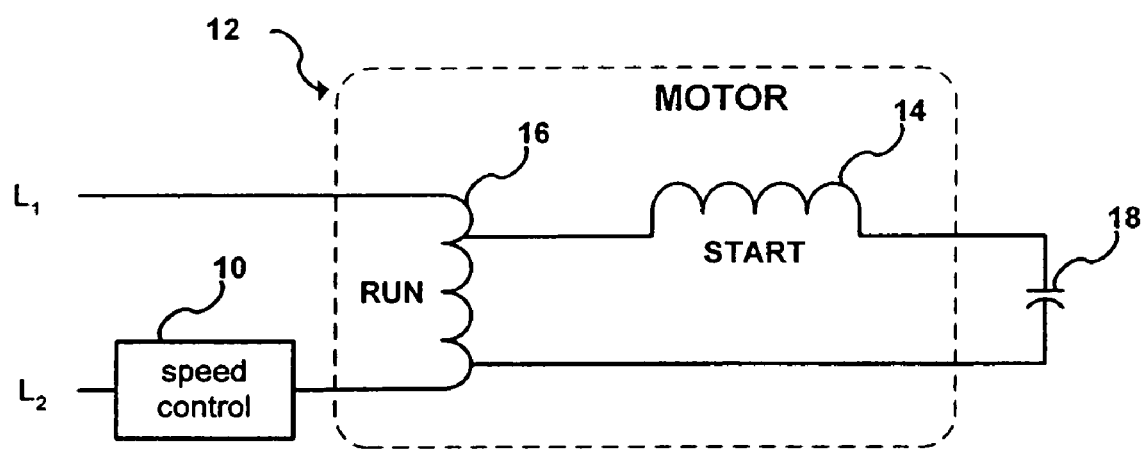
FIG. 2 is a block diagram of a conventional arrangement of a motor control circuit configured to vary a motor speed.
Figure 3:
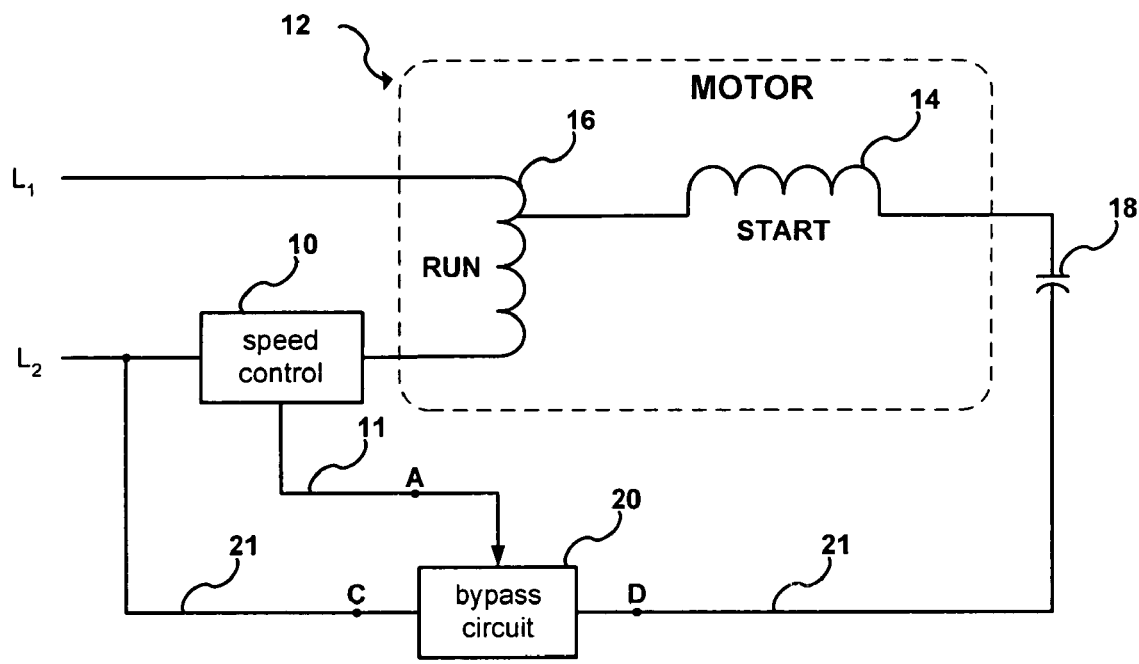
FIG. 3 is a block diagram of a variable speed motor control circuit having a bypass circuit according to an embodiment of the present invention.

Referring to FIG. 3, a block diagram of a variable speed motor control circuit having a bypass circuit according to an embodiment of the present invention is shown. In this configuration, a bypass circuit 20 is connected in series with the capacitor 18, in order to overcome the problems previously described in a PSC motor and shown in FIG. 2. Bypass circuit 20 is coupled to receive control signals from speed control 10 via path 11. Bypass circuit 20 also provides a path 21 for coupling the capacitor 18 back to line L2 directly, and not through speed control 10. Thus, the chopped voltage wave form generated by speed control 10 is not applied to capacitor 18, thereby eliminating the undesirable effects previously described.

Optionally, the circuit signal from the variable speed control 10 to bypass circuit 20 is variable from a low to high level and can be in addition inclusive of a pulse width modulated signal to achieve the required optimum performance. When certain applications provide that one are both lines (e.g., L1 and L2) are energized or de-energized by an external device, the auxiliary winding 14 may be directly connected to "C" by bypassing speed control 10 for obtaining various performance criteria or requirements.

Figure 4:
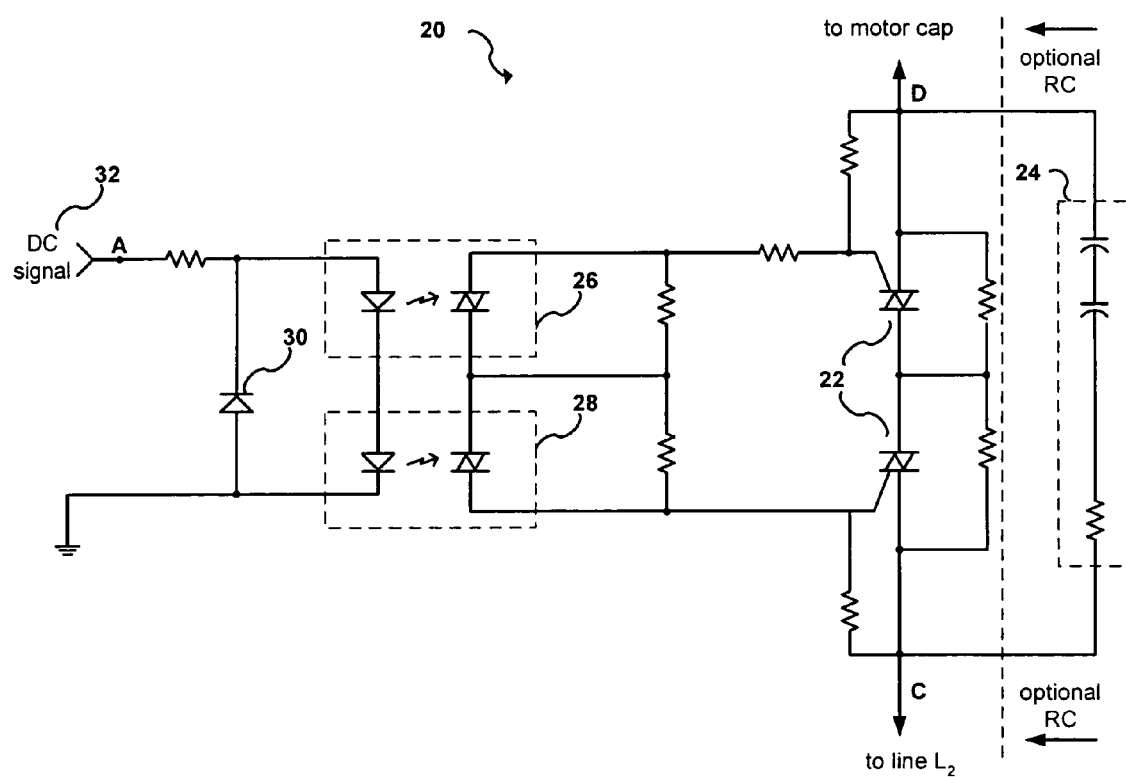
FIG. 4 is a circuit diagram of a bypass circuit according to an embodiment of the present invention.

Referring to FIG. 4, a circuit diagram of a bypass circuit according to an embodiment of the present invention is shown. In this configuration, bypass circuit 20 includes a pair of bypass triacs 22, and two optoisolators 26 and 28. The two bypass triacs 22 are coupled along a path extending between terminals C and D. Thus, as shown by FIG. 3, when bypass triacs 22 are turned on, the capacitor 18 is connected directly to line L2 through the triacs 22. It will be apparent that in this arrangement the voltage of speed control 10 will be applied to the run winding 16 only, and not to capacitor 18. Optionally, bypass circuit 20 may include an RC network 24 in parallel with the bypass triac 22, based upon the designer's degree of protection required.

Optoisolators 26 and 28, such as "MOC 3052" optoisolators, are configured to receive the control signals from speed control 10, through terminal A. More particularly, the control signal may be at a DC voltage level to cause the motor to be on or off. The voltage level operates optoisolators 26 and 28 to turn on the bypass triacs 22, such that capacitor 18 is coupled to line L2. When speed control 10 determines that the motor should be turned off, the speed control 10 electronically disconnects the run winding 16 from line L2, to halt motor operation. When this occurs, the control signal to bypass circuit 20 drops to a low DC level, causing optoisolators 26 and 28 to turn off the bypass triacs 22. This ensures that current flow through the auxiliary winding 14 cannot occur when the motor is not running.

For example, in a typical application when the input signal to speed control 10 requires speed regulation, the DC voltage at A is high and closes the circuit C to D to engage capacitor 18. Conversely, when the input signal to speed control 10 does not require speed regulation (e.g., "OFF"), the DC voltage is low and opens the circuit C to D to disengage capacitor 18.

Figure 5:
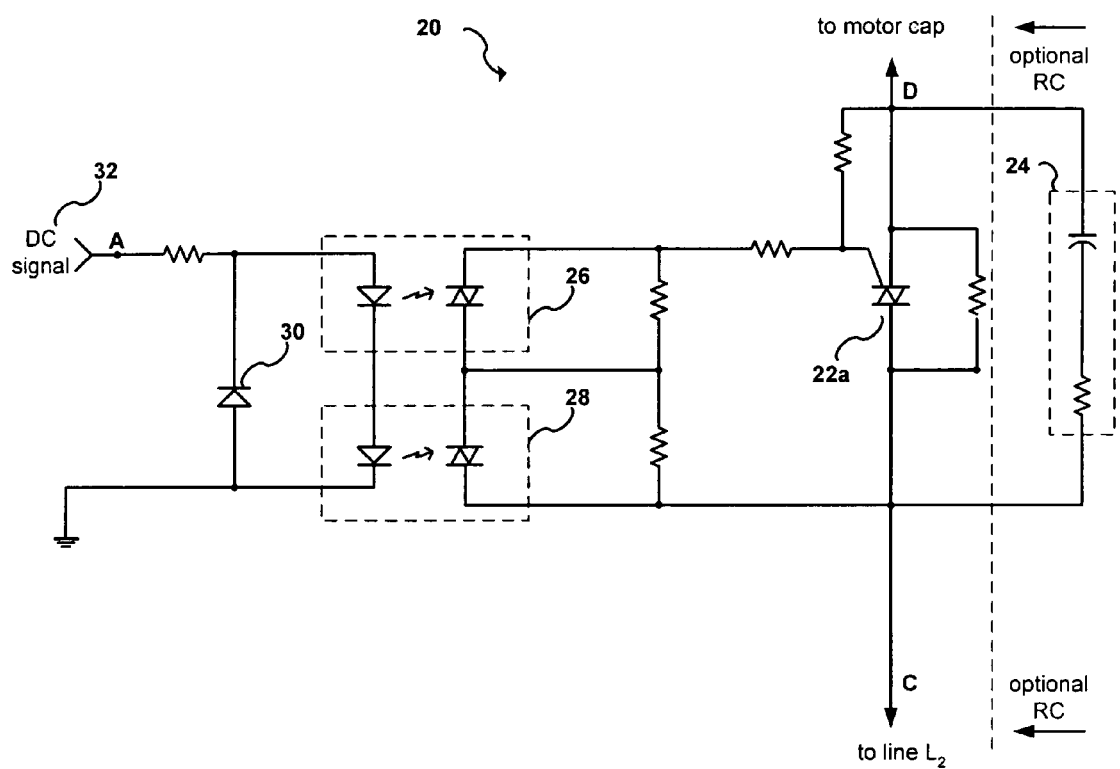
FIG. 5 is a circuit diagram of a bypass circuit according to another embodiment of the present invention.

FIG. 4 shows two bypass triacs 22 in parallel with optoisolators 26 and 28. These two bypass triacs 22 are applicable primarily to assure that 460V controllers have the necessary tolerances for 460V and above. As shown in FIG. 5, a single bypass triac 22a may optionally be used for lower line voltage applications.

A important feature of the present invention, as previously described, is auxiliary winding 14 is controlled independently from run winding 16, and the auxiliary winding 14 as well as the run winding 16 are controlled electronically. Thereby, a variable speed motor may be electronically shut down irrespective of whether the lines (e.g., L1 or L2) to the variable speed motor are permanently energized or connected to L1 and L2.

Figure 6:
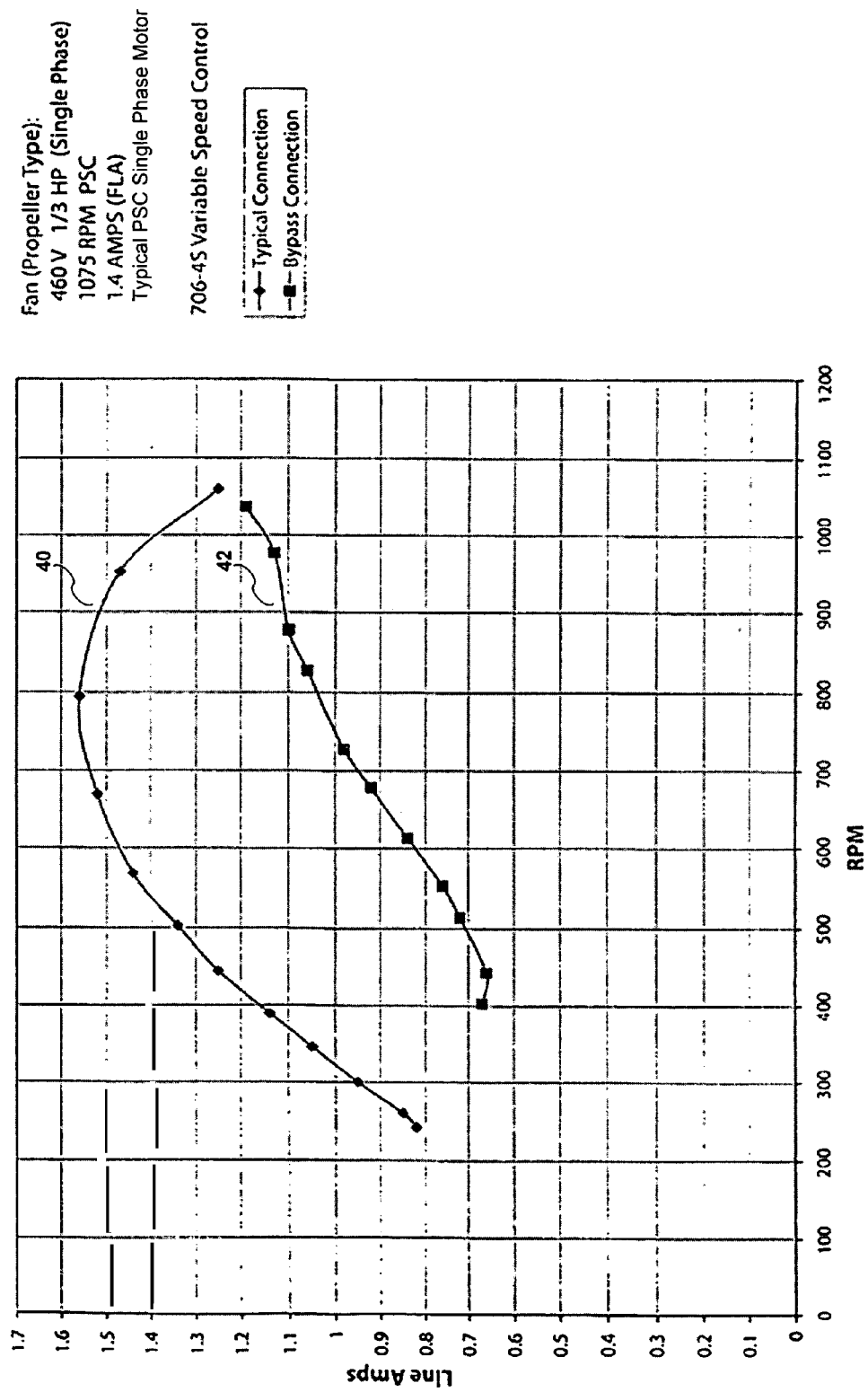
FIG. 6 is a chart illustrating an exemplary Line Amps vs. RPM of a variable speed motor control circuit having a typical connection and a bypass circuit connection according to an embodiment of the present invention.
Figure 7:
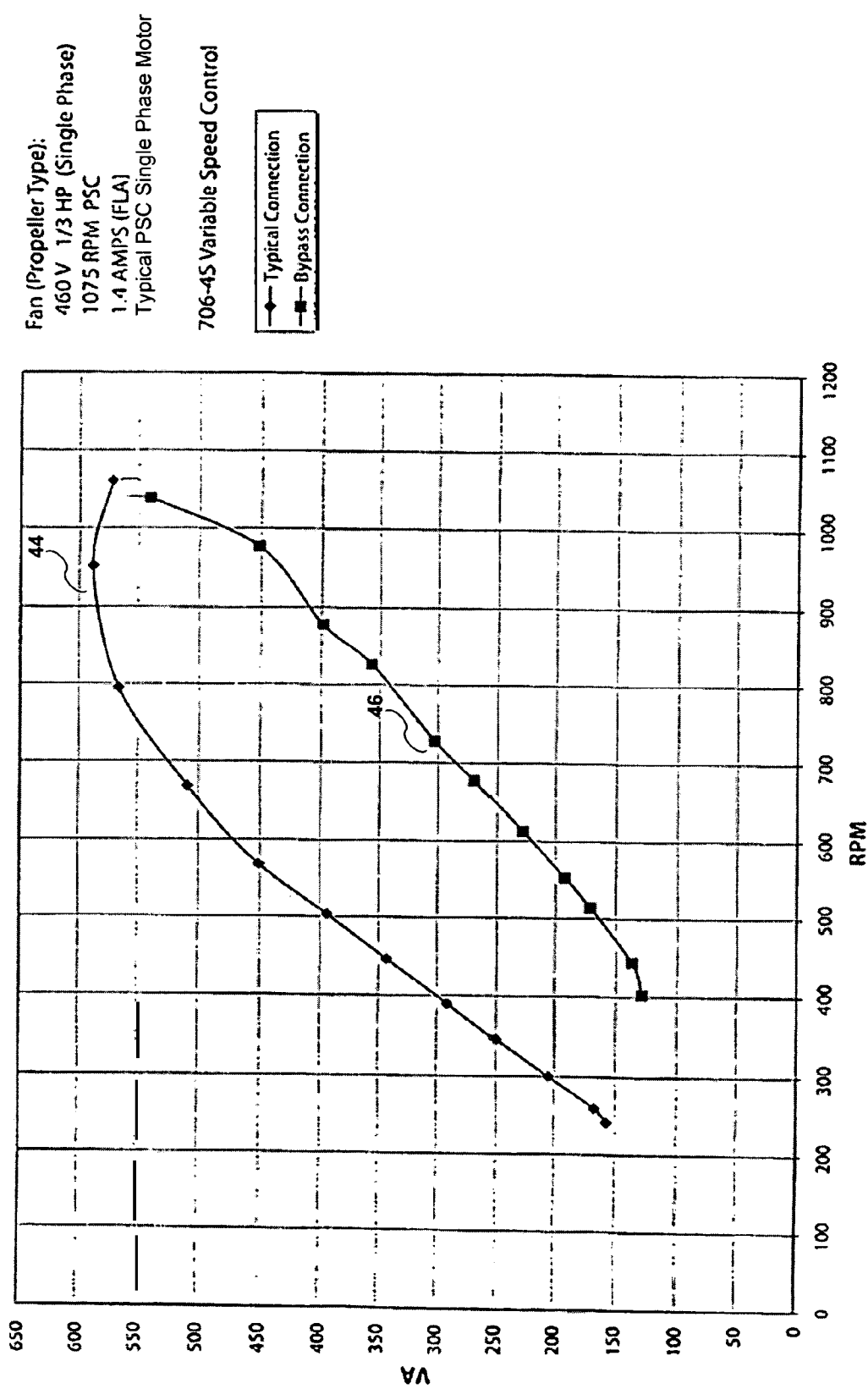
FIG. 7 is a chart illustrating an exemplary Volts-Amps (VA) vs. RPM of a variable speed motor control circuit having a typical connection and bypass circuit connection according to an embodiment of the present invention.

FIGS. 6 and 7 illustrate exemplary Line Amps vs. RPM and Volts-Amps (VA) vs. RPM, respectively, of a variable speed motor control circuit having a bypass circuit according to an embodiment of the present invention are shown. Exemplary Line Amps vs. RPM and Volts-Amps (VA) vs. RPM for a conventional variable speed motor control circuit are shown in FIGS. 6 and 7, respectively, at 40 and 44, respectively. Also, exemplary line amps to RPM and volts-amps (VA) to RPM for a variable speed motor control circuit having a bypass circuit according to an embodiment of the present invention are shown in FIGS. 6 and 7, respectively, at 42 and 46, respectively. As shown at 40 and 44, as the RPM decreases for a variable speed motor control circuit, the line amps and VA actually peak before decreasing in value. However, as shown at 42 and 46, as the RPM decreases for a variable speed motor control circuit having a bypass circuit according to an embodiment of the present invention, the line amps and VA peak is substantially reduced or totally eliminated. Thus, a variable speed motor control circuit having a bypass circuit according to an embodiment of the present invention increases the efficiency of PSC motors being variable speed motors. As such, a variable speed motor control circuit having a bypass circuit according to an embodiment of the present invention reduces power and current requirements, and substantially reduces motor heating, vibration and noise resulting from harmonic distortion.

Obviously, many other modifications and variations of the present invention are possible in light of the above teachings. The specific embodiments discussed herein are merely illustrative, and are not meant to limit the scope of the present invention in any manner. It is therefore to be understood that within the scope of the disclosed concept, the invention may be practiced otherwise than as specifically described.

The invention claimed is:

1. A control system for controlling the speed of a variable speed permanent split capacitor (PSC) motor having an auxiliary winding configured to provide torque for initial motor startup and a run winding configured to provide continuous motor operation, the motor being coupled to a capacitor configured to direct a portion of a current through the run winding when the PSC motor reaches its intended speed, the control system comprising:

a speed control unit coupled between a voltage line and the PSC motor, wherein the speed control unit is configured to control the speed of the PSC motor; and a bypass circuit coupled between the voltage line and the capacitor via a first path, wherein the bypass circuit is configured to receive a control signal from the speed control unit via a second path and to regulate a chopped voltage wave form generated by the speed control unit such that at least a portion of the chopped voltage wave form is not applied to the capacitor.

2. The control system of claim 1, wherein the bypass circuit is configured such that no portion of the chopped voltage wave form is applied to the capacitor.

3. The control system of claim 1, wherein the run winding is configured to receive the chopped voltage wave form.

4. The control system of claim 1, wherein the control signal comprises the chopped voltage wave form.

5. The control system of claim 1, wherein the bypass circuit is configured to regulate the chopped voltage wave form when the control signal is received.

6. The control system of claim 1, wherein the control signal is variable from a low level to a high level.

7. The control system of claim 6, wherein the control signal is inclusive of a pulse width modulated signal.

8. The control system of claim 1, wherein the speed control is configured to electronically disconnect the PSC motor from the voltage line to halt operation of the PSC motor, and the bypass circuit is configured to electronically disconnect the capacitor from the voltage line when the PSC motor is electronically disconnected from the voltage line.

9. The control system of claim 8, wherein the capacitor is electronically disconnected from the voltage line when the control signal to the bypass circuit drops to a low DC level.

10. The control system of claim 8, wherein the PSC motor and the capacitor are electronically disconnected from the voltage line irrespective of whether the voltage line is energized.

11. The control system of claim 1, wherein the regulation of the chopped voltage wave form by the bypass circuit is synchronized with the speed control unit.

12. The control system of claim 1, wherein the run winding and the auxiliary winding are independently and electronically controlled.

13. The control system of claim 1, wherein the bypass circuit comprises a pair of triacs and a pair of optoisolators, wherein the pair of optoisolators are operated by the control signal to turn on the pair of triacs such that the capacitor is coupled to the voltage line.

14. The control system of claim 13, wherein the pair of optoisolators are operated by the control signal to turn off the pair of triacs such that the capacitor is disconnected from the voltage line.

15. The control system of claim 1, wherein the bypass circuit comprises a triac and a pair of optoisolators, wherein the pair of optoisolators are operated by the control signal to turn on the triac such that the capacitor is coupled to the voltage line.

16. The control system of claim 15, wherein the pair of optoisolators are operated by the control signal to turn off the triac such that the capacitor is disconnected from the voltage line.

17. The control system of claim 1, wherein chopped voltage wave form comprises variable portions of a voltage wave form.

18. The control system of claim 1, wherein the voltage line is neutral.

19. A method for controlling the speed of a variable speed permanent split capacitor (PSC) motor having an auxiliary winding configured to provide torque for initial motor startup and a run winding configured to provide continuous motor operation, the motor being coupled to a capacitor configured to direct a portion of a current through the run winding when the PSC motor reaches its intended speed, the method comprising:

coupling a voltage line and the PSC motor with a speed control unit configured to control the speed of the PSC motor;

coupling the voltage line and the capacitor with a bypass circuit via a first path;

receiving by the bypass circuit a control signal from the speed control unit via a second path; and regulating by the bypass circuit a chopped voltage wave form generated by the speed control unit such that at least a portion of the chopped voltage wave form is not applied to the capacitor.

20. The method of claim 19, wherein the chopped voltage wave form is regulated such that no portion of the chopped voltage wave form is applied to the capacitor.

21. The method of claim 19, further comprising receiving by the run winding the chopped voltage wave form.

22. The method of claim 19, wherein regulating the chopped voltage wave form occurs when the control signal is received.

23. The method of claim 19, wherein the control signal is variable from a low level to a high level.

24. The method of claim 23, wherein the control signal is inclusive of a pulse width modulated signal.

25. The method of claim 19, further comprising:

electronically disconnecting via the speed control the PSC motor from the voltage line to halt operation of the PSC motor; and electronically disconnecting via the bypass circuit the capacitor from the voltage line when the PSC motor is electronically disconnected from the voltage line.

26. The method of claim 19, further comprising independently and electronically controlling the run winding and the auxiliary winding.

27. The method of claim 19, wherein the bypass circuit comprises at least one triac and a pair of optoisolators, wherein the method further comprises operating the pair of optoisolators to turn on the at least one triac such that the capacitor is coupled to the voltage line when the control signal is received.

28. The method of claim 27, further comprising operating the pair of optoisolators to turn off the at least one triac such that the capacitor is disconnected from the voltage line.

29. The method of claim 19, wherein coupling the voltage line and the PSC motor with a speed control unit comprises coupling the voltage line to the bottom of the run winding of the PSC motor via the speed control unit.

30. The method of claim 29, further comprising coupling a second voltage line to the top of the run winding of the PSC motor.

31. The method of claim 30, wherein the second voltage line is neutral.

* * * * *